(12) United States Patent
Sato et al.

(10) Patent No.: US 7,144,472 B2
(45) Date of Patent: Dec. 5, 2006

(54) PREPREG PRODUCTION METHOD AND PREPEG PRODUCTION DEVICE AND PREPREG OBTAINED BY THE PRODUCTION METHOD AND PRODUCTION METHOD FOR INSULATING LAYER ATTACHED COPPER FOIL AND INSULATING LAYER ATTACHED COPPER FOIL OBTAINED BY THE PRODUCTION METHOD

(75) Inventors: Tetsuro Sato, Ageo (JP); Noriyuki Nagashima, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 251 days.

(21) Appl. No.: 10/470,166

(22) PCT Filed: Dec. 12, 2002

(86) PCT No.: PCT/JP02/13004

§ 371 (c)(1),
(2), (4) Date: Jul. 24, 2003

(87) PCT Pub. No.: WO03/051964

PCT Pub. Date: Jun. 26, 2003

(65) Prior Publication Data

US 2004/0062858 A1    Apr. 1, 2004

(30) Foreign Application Priority Data

Dec. 18, 2001   (JP) ............................. 2001-385087
Jul. 17, 2002   (JP) ............................. 2002-207674

(51) Int. Cl.
*B32B 37/00*   (2006.01)

(52) U.S. Cl. ................ 156/307.1; 156/307.3; 156/324; 427/374.1; 427/385.5

(58) Field of Classification Search ................ 156/289, 156/307.1, 307.3, 307.4, 307.5, 307.7, 324; 427/96.1, 372.2, 374.1, 385.5, 386, 388.1, 427/388.4
See application file for complete search history.

(56) References Cited

U.S. PATENT DOCUMENTS 4,087,300 A * 5/1978 Adler .......................... 156/184

(Continued)

FOREIGN PATENT DOCUMENTS

EP         231737 A2     8/1987

(Continued)

*Primary Examiner*—Steven D. Maki
*Assistant Examiner*—John L. Goff
(74) *Attorney, Agent, or Firm*—Rothwell, Figg, Ernst & Manbeck, P.C.

(57) ABSTRACT

A production method capable of stably producing a prepreg and a copper foil with thin insulating layer using a thin backbone material capable of securing excellent laser holemaking property. A method for producing a prepreg for use in producing a printed wiring board having a backbone material impregnated with a thermosetting resin comprising the following steps is adopted:
(1) a liquid resin coat forming step for forming a liquid resin layer on a flat work plane using a liquid thermosetting resin;
(2) a pre-drying step for changing the liquid resin layer to a dry resin layer;
(3) a backbone material pre-adhesion step for heating and pressure bonding the backbone material on the above described dry resin layer on the work plane to form a dry resin layer with backbone material;
(4) a resin impregnation step for heating the dry resin layer with backbone material to a temperature where the resin is reflowable, and impregnating the backbone material with the resin component; and
(5) a cooling step for carrying out a temperature decreasing operation immediately after finishing the resin impregnation, and maintaining a half-cured state of the thermosetting resin impregnated in the backbone material to form the prepreg. A method for producing a copper foil with insulating layer in the similar manner is further provided.

15 Claims, 8 Drawing Sheets

U.S. PATENT DOCUMENTS

4,496,415 A * 1/1985 Sprengling .................. 156/283
4,909,886 A * 3/1990 Noguchi ..................... 156/285

FOREIGN PATENT DOCUMENTS

| JP | 58-118241 A | 7/1983 |
| JP | 58-185216 A | 10/1983 |
| JP | 11-320758 A | 11/1999 |
| JP | 2001-96665 A | 4/2001 |
| JP | 2001-177199 A | 6/2001 |
| WO | WO 01/01740 A1 | 1/2001 |

* cited by examiner

FIG. 1

(1) Liquid resin coat forming step

(2) Pre-drying step

FIG. 2

(3) Non-woven fabric pre-adhesion step

FIG. 3

(4) Resin impregnating step (5) Temperature decreasing step

(1) Liquid resin coat forming step

(2) Pre-drying step

Fig. 7

(3) Non-woven pre-adhesion step

FIG. 8

(4) Resin impregnating step (5) Temperature decreasing step

PREPREG PRODUCTION METHOD AND PREPEG PRODUCTION DEVICE AND PREPREG OBTAINED BY THE PRODUCTION METHOD AND PRODUCTION METHOD FOR INSULATING LAYER ATTACHED COPPER FOIL AND INSULATING LAYER ATTACHED COPPER FOIL OBTAINED BY THE PRODUCTION METHOD

TECHNICAL FIELD OF THE INVENTION

The present invention relates to a method and a device for producing a prepreg and the prepreg obtained by the production method.

BACKGROUND ART

A prepreg has been used as an interlayer insulating material for a printed wiring board for use in the field of electric and electronic industries. The prepreg includes various products including a paper-phenol prepreg in which paper, a backbone material, is impregnated with a phenolic resin, a glass-epoxy prepreg in which a glass cloth, a backbone material, is impregnated with an epoxy resin, a glass-polyimide prepreg in which the glass cloth, a backbone material, is impregnated with a polyimide resin. In recent years, in accordance with the trend of a thinner layer thickness for the printed wiring board, there has also been a growing demand for the prepreg, which is a component for the interlayer insulating layer of the printed wiring board, having a thinner thickness as well as high reliability.

Figure 5:
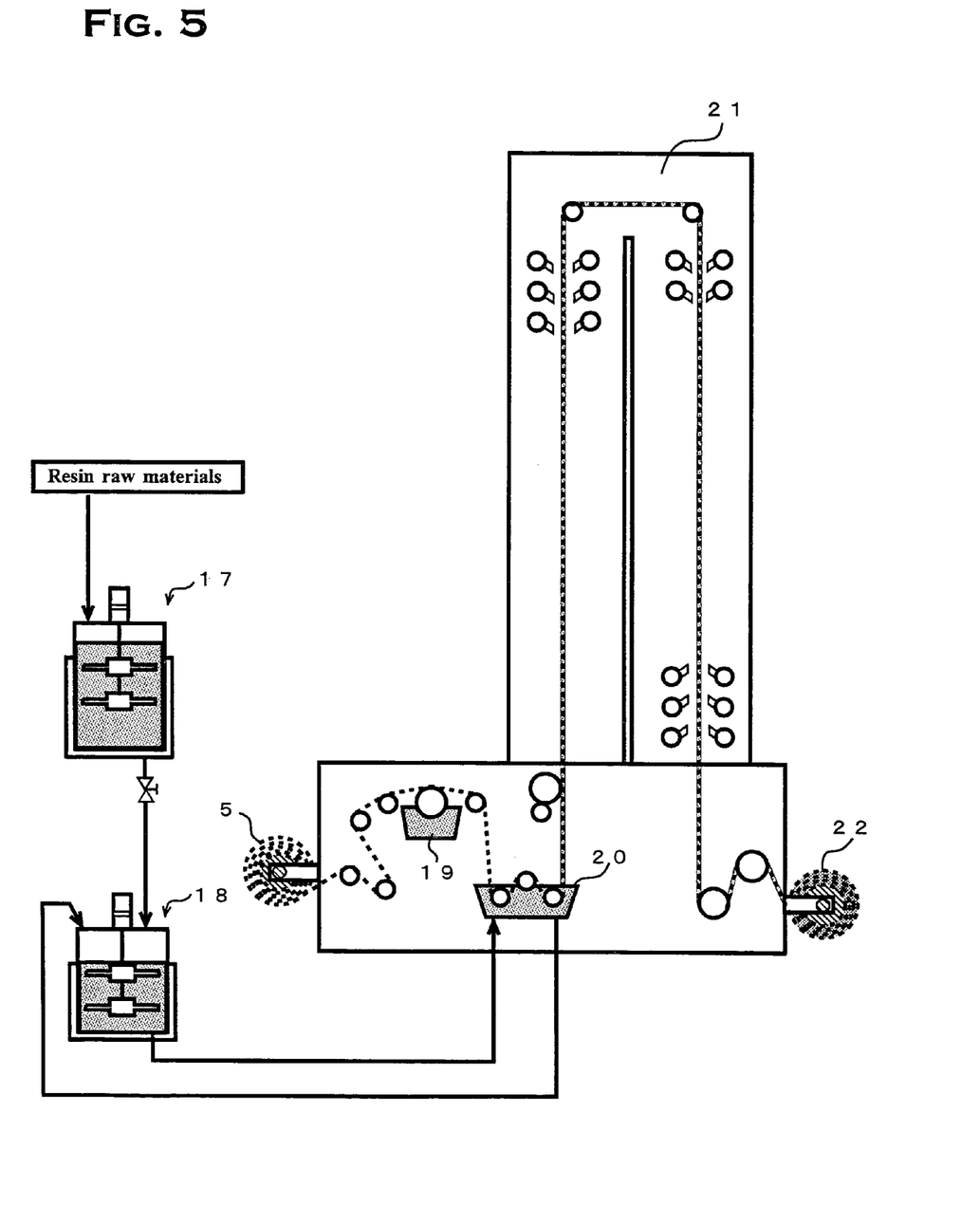
FIG. 5 shows a schematic view of a conventional method for producing a prepreg.

For the method for producing the prepreg, each producer adopts a production method having distinctive features. Referring to a basic configuration of a general prepreg production device without accessory equipment such as an accumulator, the production method as shown in FIG. 5 will be the one adopted most widely, in which a resin composition for impregnating the backbone material is produced as vanish using a vanish reaction vessel 17 with a formulation having various characteristics. The vanish is sent to a circulation tank 18, from where the vanish is sent to an impregnation vat 20 in a step for impregnating the backbone material with the resin for circulation.

The step for impregnating the backbone material with the resin comprises means for axially bearing the backbone material roll and for continuously unwinding the backbone material 5. The backbone material 5 unwound therefrom is typically sent through a pre-impregnation vat 19 to the impregnation vat 20, where the backbone material 5 is subjected to resin impregnation either by dipping or by kiss-coating. After the impregnation vat 20, the impregnated backbone material is run through a vertically arranged drying tower 21 adopting a heating method such as hot air circulation or heat radiation for drying the impregnated resin to a half-cured state (B-stage) and is finally cooled to be wound and collected as a prepreg roll 22.

The prepreg produced in this manner has been widely accepted into a market when a backbone material having a weave texture such as a glass cloth is used, because the prepreg having a thickness of 30 μm can be produced by use of the cloth having a thickness of about 20 μm, although there are some problems such as a crease of the cloth and the like.

The use of a prepreg employing a backbone material having a weave texture such as a glass cloth, however, has caused a problem when forming a via hole in which carbon dioxide laser hole-making is required after it is processed to a copper clad laminate. More specifically, the hole-making of the copper clad laminate with a carbon dioxide laser causes a bad shape to an inner wall of the via hole after the hole-making due to inferior workability of the glass cloth in an interlayer insulating layer.

Non-woven fabric type backbone materials, such as a glass non-woven fabric, an aramid non-woven fabric and the like, have recently been used instead of cloth-type backbone materials in order to solve such a problem. Certainly, the shape of the inner wall of the via hole or the like formed with the carbon dioxide laser has been remarkably improved by replacing the backbone material with a non-woven fabric, and thus great progress has been achieved in the art.

A non-woven fabric is not like a cloth-type which is alternately woven by warps and wefts, but like a felt, it is made to a sheet by pressing a glass fiber, an aramid fiber or the like. Consequently, the strength of the non-woven fabric backbone material itself is lower, and the resistance to external stress, such as tensile stress, is smaller, compared with the cloth-type backbone material.

When drying the resin impregnated non-woven fabric with the method employing the above described vertical drying tower, the non-woven fabric with a required quantity of resin impregnated has to run through the drying tower under the load of the weight of the impregnated resin. The thinner the non-woven fabric is, more frequently it tends to break in the drying tower before the impregnated resin becomes a half-cured state to cause to suspend the process, thereby remarkably reducing a production yield. Such a problem tends to occur very frequently when the non-woven fabric for use as a backbone material has a nominal thickness of 70 μm or less, but the use of the non-woven fabric having a nominal thickness of 30 μm or less as a backbone material has been regarded as almost impossible.

Even when using a woven fabric such as a glass cloth as the backbone material, the above described conventional resin impregnation method naturally cannot secure safety of the process due to a tendency of rupture in the vertical drying tower, if the woven fabric having a thickness of 20 μm or less is to be impregnated and dried. A woven fabric may tend to break less likely than a non-woven fabric, but a thin woven fabric is not highly reliable as compared with a thick woven fabric.

From the above, the establishment of a production method capable of stably producing the prepreg having an unprecedented thickness by using a non-woven or woven fabric as the backbone material has been awaited in the market, as the prepreg capable of securing the above described carbon dioxide laser hole-making property.

DISCLOSURE OF THE INVENTION

The inventors of the present invention have energetically studied and found that it is possible to stably produce a prepreg using a non-woven fabric having a thickness of 70

μm or less as a backbone material and a prepreg using a very thin glass cloth having a thickness of 30 μm or less as a backbone material by employing the method for producing a prepreg as described below.

In the claim, a method for producing a thin prepreg in use for producing a printed wiring board having a backbone material impregnated with a thermosetting resin comprises the following steps 1 to 5. Each step will now be described step-by-step referring to FIGS. 1 to 3.

Figure 1:
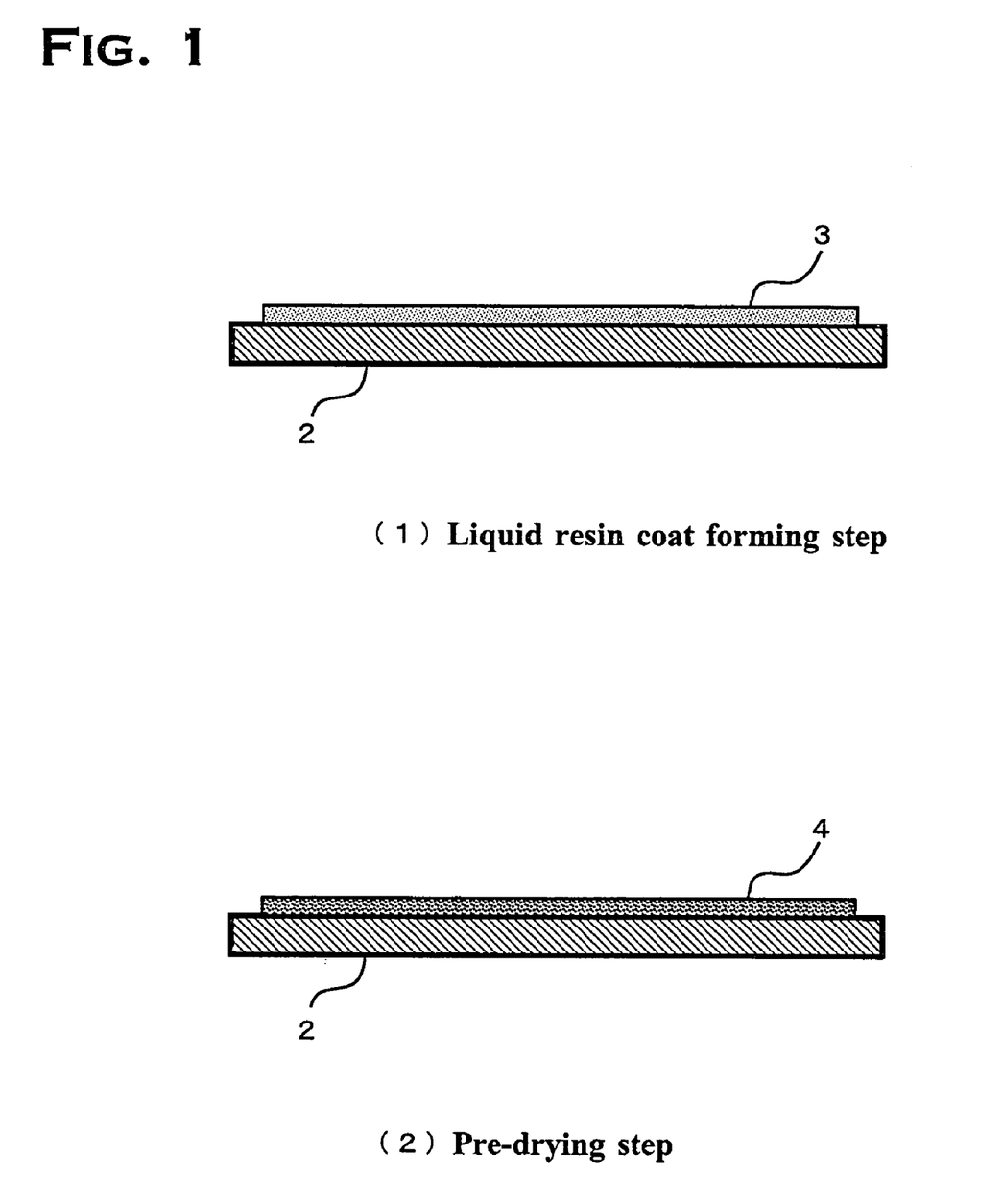
FIGS. 1 to 3 and FIGS. 6 to 8 show schematic views for illustrating the flow of the method for producing the prepreg according to the present invention.

The step (1) is a liquid resin coat forming step for forming a liquid resin layer 3 as a coat having a predetermined thickness on a flat work plane 2 using a liquid thermosetting resin, as schematically shown in FIG. 1 (1). The liquid thermosetting resin means an epoxy resin compound obtained by mixing an epoxy resin, a curing agent, a curing accelerator and the like with a solvent, or the like, which is in the state having a low enough viscosity to be applicable on the work plane 2. This liquid thermosetting resin is the resin to be impregnated into the backbone material.

The work plane 2 is a plane mainly composed of a metallic material such as copper, titanium, aluminum, stainless steel or the like, and as seen from the following production method, it may include those having heat resistance to the heat to be applied at a heating operation for forming a half-cured resin. For example, the aluminum with a fluororesin or the like applied on its surface having a heat resistance of 200° C. or higher may be used.

Any kind of method, such as coating into a uniform thickness with a coating machine, or extending a certain amount of resin placed on the work plane 2 into a uniform thickness with a tool like a squeegee, may be used without any limitation as a method for forming the liquid resin layer 3 as a coat having a predetermined thickness on a flat work plane using the liquid thermosetting resin. Conventional prepreg has been typically impregnated with an equal amount of resin per unit weight of the backbone material for the prepreg. The above expression "as a coat having a predetermined thickness", however, is due to the difficulty to define an amount of resin impregnated as an explicit numerical value at this stage, since the amount of resin impregnated is different depending on the thickness of a non-woven or woven fabric as a backbone material and type of the backbone material. At the present stage the following can be clearly described: in order to stabilize properties such as peel strength, migration resistance and the like of a copper clad laminate when a copper foil is laminated, formulations are preferably adjusted such that the weight of an aramid non-woven fabric in a prepreg is 20% to 40% by weight in the case the aramid non-woven fabric is used, and the weight of a glass non-woven fabric in a prepreg is 20% to 50% by weight in the case the glass non-woven fabric is used.

The step (2) is a pre-drying step for drying the liquid resin layer 3 formed on the work plane 2 leaving as it is to form a dry resin layer 4, as schematically shown in FIG. 1 (2). The step is the one having a very important technical context in the present invention. The step itself is to dry the liquid resin layer 3 formed on the work plane 2 leaving as it is to form a dry resin layer 4, so that the solvent used for adjusting a liquid thermosetting resin is removed by heating the liquid resin layer 3 for a short time or air-drying by exposing the liquid resin layer 3 in the atmosphere for a fixed time period, or by a combination of both of these techniques. Consequently, the dry resin layer 4 is in a state where the solvent is removed. If subjected to only air-drying, the dry resin layer 4 is in a state where a non-cured resin is included in which curing is not taken place. If subjected to heating to dry, the dry resin layer 4 is in a state of half-curing. The loss on heating, which means the decrease of weight when the solvent in the liquid thermosetting resin is removed, is preferably in the range of 0% to 10% by weight. The larger value of the loss on heating means a lower viscosity containing larger amount of solvent. The loss on heating of 0% is included because a liquid thermosetting resin without using any solvent may also be adjusted. Strictly speaking, the loss on heating, when solvent is used, is preferably in the range of 0.1% to 10% by weight.

If a backbone material is directly overlapped on the surface of the liquid resin layer 3 on the work plane 2, impregnated with a resin and heated for drying the resin, without bringing the liquid resin layer 3 using a solvent into a dry state, bubbles generated with the removal of the solvent may remain within a prepreg being trapped between the fibers of the backbone material, resulting in preventing the formation of a good prepreg. When the loss on heating is 10% by weight or higher, longer time is required for removing solvent by the air-drying and sufficient removal of solvent becomes difficult, resulting in higher probability of occurrence of bubbles. On the other hand, when the loss on heating is 0.1% or less, curing is so easily taken place upon heating, resulting in difficulty in leaving the resin in a half-cured state suitable for a prepreg after the resin is caused to reflow as described below.

Figure 2:
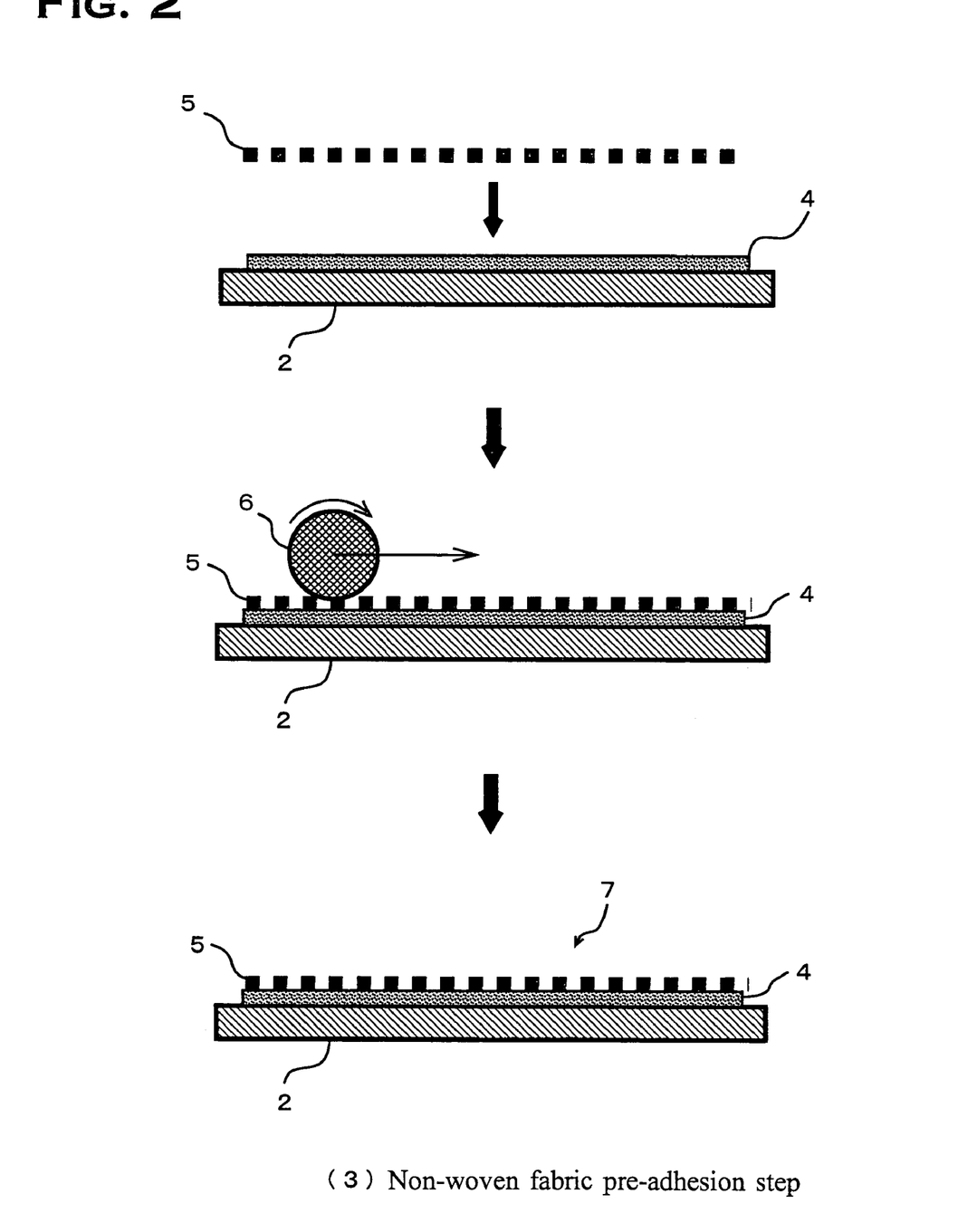

The step (3), which is carried out after the liquid resin layer 3 is changed to the dry resin layer 4, is a backbone material pre-adhesion step for overlapping the backbone material 5 on the surface of the above described dry resin layer 4 on the work plane 2, pre-heating and pressure bonding to form a dry resin layer with backbone material 7, as schematically shown in FIG. 2 (3). The backbone material pre-adhesion step is a step for sticking a non-woven or woven fabric 5, which is a backbone material, on the above described dry resin layer 4 on the work plane 2. As described as "pre-heating and pressure bonding", this step is only for sticking the non-woven or woven fabric 5, which is a backbone material, on the surface of the above described dry resin layer 4 and does not includes resin impregnation.

The pre-heating and pressure bonding is carried out either by sticking the backbone material 5 on the surface of the dry resin surface 4 using a heating roll 6, such that they form a generally uniform plane without defects such as winkles, or by uniformly sticking by pressing the non-woven or woven fabric 5, which is a backbone material, placed on the dry resin layer 4 with a heating press plate or the like instantaneously in a low pressure. The resulting layer is called "a dry resin layer with backbone material", for convenience' sake of the description in the present specification. Thus, a good plane form without wrinkles or creases in a backbone material can easily be formed by sticking the backbone material to a resin layer temporarily in a half-cured state. In addition, the resin impregnation is not carried out in the state of pressing by the heating roll or the heating press plate, so that the adhesion of the resin to these devices is prevented, thereby enabling to repeat continuous operation.

The thickness of the backbone material 5 used here is not limited, but in view of the object of the present invention, a non-woven fabric having a nominal thickness of 70 μm or less or a woven fabric having a nominal thickness of 30 μm or less is to be used. The type of the non-woven or woven fabric may include the material usable for a prepreg for a printed wiring board such as an aramid fiber, a glass fiber or the like. Particularly in the case of a woven fabric, an SP cloth, in which fibers composing the woven fabric opens in a plane and a cross-sectional profile of crosswise strands is flat, is more preferable in consideration of carbon dioxide laser property. In addition, the surface of the fibers composing these backbone materials is preferably subjected to silane coupling agent finishing in an amino-based silane coupling agent tower in order to improve wettability with resins from a view point of the prevention of void generation and interfacial separation.

Figure 3:
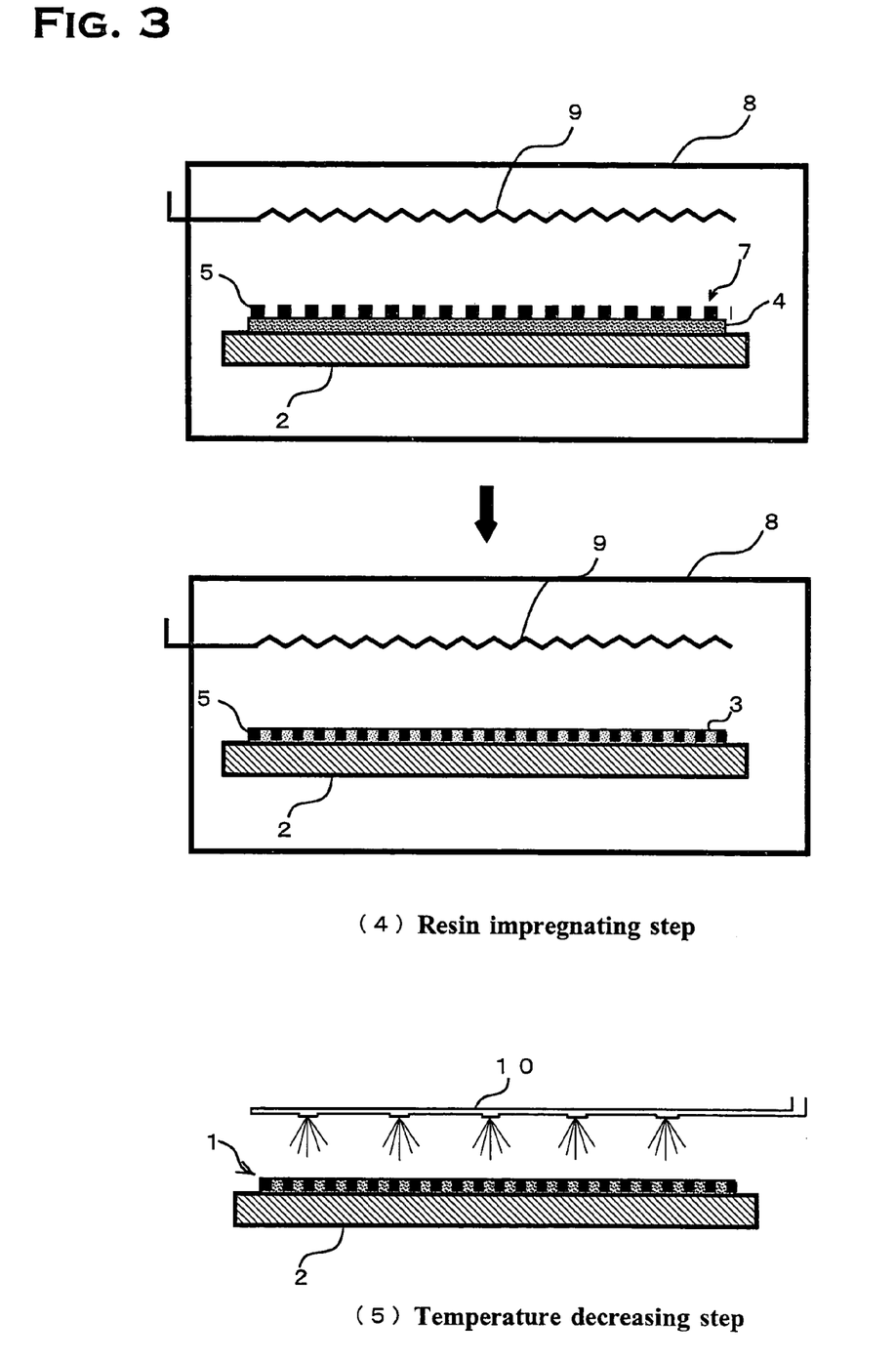

The step (4) is a resin impregnation step for heating the dry resin layer with backbone material 7 while placing it on the work plane 2, at a temperature where the resin in the dry resin layer 4 is reflowable, and impregnating the backbone material 5 with a thermosetting resin component, as schematically shown in FIG. 3 (4). As seen in the previous steps, the backbone material itself is not overloaded even when a thin backbone material is used. Also in this resin impregnation step, the dry resin layer with backbone material 7 is heated while placing it on the work plane 2 at a temperature where the resin is reflowable, and the backbone material 5 is impregnated with a thermosetting resin component. Thus, since the weight of the impregnated resin does not apply a load to the material itself, the backbone material is not pulled by the resin weight and will not be broken even it is thin.

In the resin impregnation step, the resin composing a dry resin layer of the dry resin layer with backbone material 7 is heated at a temperature where the resin is only caused to reflow but not cured. The reflow resin enters into clearances between fibers of the backbone material 5 and absorbed up to the backbone material by a capillary phenomenon. As long as confirmed by the inventors, the reflow resin permeates through the backbone material 5 to cover the whole backbone material 5, thereby obtaining an impregnation state similar to a conventional prepreg.

After the resin impregnation, a temperature decreasing step is provided as the step (5), as schematically shown in FIG. 3 (5), in which a temperature decreasing operation is immediately carried out to prevent the impregnated thermosetting resin from completely cured, such that a prepreg is formed by maintaining a half-cured state of the thermosetting resin impregnated in the backbone material 5. The temperature decreasing step may include ambient cooling and air blast cooling using an air blower 10 as shown in FIG. 3 (5). No particular temperature decreasing operation with a device capable of producing cooled air of room temperature or below is needed.

After the temperature decrease operation, a prepreg 1 is obtained in which the backbone material 5 is impregnated with a thermosetting resin, and the thermosetting resin is in a state of half-cured. As described above, the resin impregnation to the backbone material 5 can be carried out while it is placed on a plane of a resin impregnating operation table, so that the weight of the impregnated resin is not loaded to the backbone material itself. Consequently, even when the thickness of the backbone material 5 is extremely decreased, a process trouble such as the break of the backbone material 5 pulled by the resin weight can be eliminated.

Figure 4:
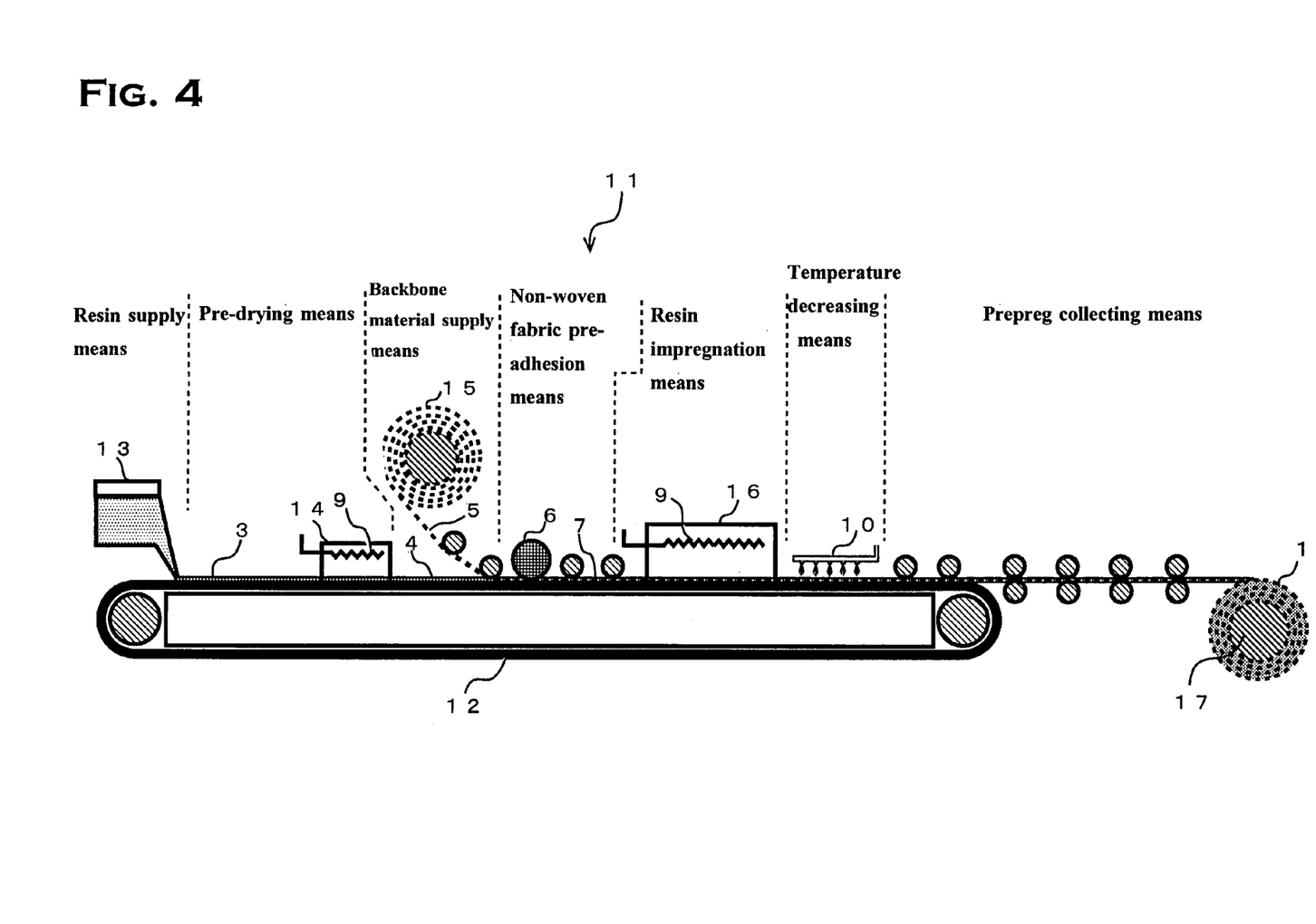
FIG. 4 shows a schematic side view for illustrating a layout concept for the continuous production device of the prepreg according to the present invention.

When the above described method for producing a prepreg is carried. out, use of a continuous production method to be described below is very desirable from the view point of enhancing production efficiency. FIG. 4 schematically shows a production line for carrying out the continuous production method. The following description will be made with reference to FIG. 4.

A continuous production device for use in carrying out the method for producing the prepreg according to claim 1, which is used for producing a printed wiring board having a backbone material impregnated with a thermosetting resin, is provided, wherein one production line is provided by combining a metal belt traveling endlessly with an endless track, resin supply means for forming a thermosetting liquid resin layer on the above described metal belt, pre-drying means for changing the above described liquid resin layer to a dry resin layer, backbone material supply means for continuously supplying a backbone material into a production line, backbone material pre-adhesion means for preliminarily pressure bonding the above described backbone material to the above described dry resin layer, resin impregnation means for heating the part in which the above described backbone material is preliminarily pressure bonded to the above described dry resin layer to carry out resin impregnation, temperature decreasing means for carrying out a temperature decreasing operation after finishing the resin impregnation to form a prepreg, and means for collecting a completed prepreg, wherein the metal belt at least continuously travels from the resin supply means to the cooling means, from an upstream toward a downstream through steps; the resin supply means comprises a resin dispenser at the starting end of the upstream of the metal belt, which resin dispenser is capable of continuously supplying the liquid thermosetting resin on the above described metal belt and forming the uniform liquid resin layer having a predetermined thickness on the above described metal belt; a drying zone is provided at the downstream of the above described resin supply means, the drying zone carrying out heat drying or air-drying as the pre-drying means for changing the above described liquid resin layer on the above described metal belt to the dry resin layer; the backbone material supply means is provided at the downstream of the above described pre-drying means, the backbone material supply means continuously unwinding the backbone material from a backbone material stock roll in synchronization with the traveling speed of the metal belt; the backbone material pre-adhesion means is provided at the downstream of the above described backbone material supply means, the backbone material pre-adhesion means heating and pressure bonding the backbone material supplied from the backbone material supply means to the surface of the above described dry resin layer on the above described metal belt with a heating roll; a heating zone is provided as the resin impregnation means at the downstream of the above described backbone material pre-adhesion means, in which the part of the dry resin layer with the backbone material pre-bonded is heated at a curing temperature of the resin or below to cause to reflow the thermosetting resin and impregnate the stacked backbone material with the flowable resin;

a cooling zone is provided as the temperature decreasing means at the downstream of the above described resin impregnation means, in which a temperature decreasing operation by ambient or forced cooling to form the prepreg is carried out after finishing the resin impregnation to maintain a half-cured state of the thermosetting resin impregnated in the backbone material to form the prepreg; and a winder for rolling the completed prepreg or a cutter for forming cut sheets from the completed prepreg is provided at the downstream of the above described temperature decreasing means as the collecting means of the prepreg.

At the center of the continuous production device 11, the metal belt 12, which travels endlessly with an endless track, is provided. The metal belt 12 at least continuously travels from the resin supply means to the cooling means, from the upstream toward the downstream through the steps. The expression "at least continuously" is used in consideration of the possibility that the traveling region of the metal belt varies depending on designs of the device. The metal belt 12 herein described is a flexible metal band capable of endlessly traveling with an endless track such as a conveyor. Therefore, the type of the metal material for composing the metal belt, such as copper, copper alloy, aluminum, and stainless steel, is not limited if it has a heat resistance of 200° C. or higher. However, in order to be flexible, it needs to be like a metal strip or a metal foil having a certain thin thickness, and the one having a thickness of 50 µm to 400 µm is used from the view point of creating a uniform plane.

The surface of the metal belt 12 may be a smooth surface or may have some unevenness in it. The "some unevenness" is preferably approximately a roughness of the surface for adhesion used as a surface to be stacked with a base resin of an electrodeposited copper foil, specifically, a surface roughness (Rz) of about 5.0 µm to about 24.0 µm. When continuously supplying a liquid thermosetting resin described below on the above described metal belt 12 and forming the liquid resin layer 3 on the metal belt 12, the "some unevenness" can prevent the resin from flowing laterally on the metal belt 12 even when the liquid resin has a low viscosity and provides excellent shape maintaining performance in forming the liquid resin layer 3. If the roughness of the unevenness of the surface of the metal belt 12 reaches Rz=24.0 µm, the thickness of the liquid resin layer 3 described below cannot be uniform. If the roughness of the unevenness of the surface of the metal belt 12 reaches Rz=5.0 µm, the shape maintaining performance in forming the liquid resin layer 3 is equal to the case of a mirror surface.

The resin supply means is provided at the starting end of the upstream of the metal belt 12. In the present specification, the resin supply means comprises the resin dispenser 13 for continuously supplying the liquid thermosetting resin on the above described metal belt 12 and capable of forming the uniform liquid resin layer 3 having a predetermined thickness on the above described metal belt 12. The herein described resin dispenser 13 may include an integral device such as an edge coater or a lip coater, which can simultaneously achieve the function for continuously supplying the liquid thermosetting resin on the metal belt 12 and the function for forming the liquid resin layer 3 having a predetermined thickness on the metal belt 12. The resin dispenser 13 is also described as the concept including both devices, each device comprising a unit performing one or the other of these functions, so that any devices, which can achieve similar functions, may also be usable without any problem.

For the part which is formed into the liquid resin layer 3 having a uniform and predetermined thickness on the metal belt 12, the above described liquid resin layer 3 on the above described metal belt 12 is changed into the dry resin layer 4 by providing the drying zone 14 as pre-drying means. downstream of the above described resin supply means. The drying zone may employ heat drying as shown in FIG. 4 when the line speed is high to quickly dry, and air-drying when the line speed is sufficiently low. The herein described air-drying means either a state simply left to stand in the air, or air-blasting by a fan.

The backbone material supply means for continuously supplying the backbone material 5 into the production line is then provided at the downstream of the above described pre-drying means. The backbone material supply means continuously supply and overlap the backbone material 5 which is continuously unwound from the backbone material stock roll 15 onto the surface of the above described dry resin layer 4 on the above described metal belt 12. Next, the unwound speed of the backbone material 5 from the backbone material stock roll 15 and the traveling speed of the metal belt 12 are adapted to be matched and synchronized. This is for sticking the backbone material as a uniform plane without generating wrinkles.

The backbone material pre-adhesion means is provided at the downstream of the backbone material supply means. The backbone material pre-adhesion means continuously heats and pressure bonds the backbone material 5 supplied from the backbone material supply means to the surface of the dry resin layer 4 using the heating roll 6 to form the dry resin layer with backbone material 7. The pressure bonding of the backbone material 5 with the heating roll 6 is carried out employing such a low pressure as only the resin at the surface layer of the dry resin layer 4 is caused to reflow by the heat of the heating roll 6 and the backbone material 5 sticks with no problem, but the flowable resin of the dry resin layer 4 will not ooze through the backbone material 5. This is like a temporary bonding. If the resin oozes, it sticks to the surface of the heating roll 6, which makes the continuous production impossible.

The heating zone 16 is then provided as the resin impregnation means downstream of the above described backbone material pre-adhesion means, in which the part in the form of the dry resin layer with backbone material 7 is heated at a curing temperature of the resin or below to cause reflow of the thermosetting resin and impregnate the stacked backbone material 5 with the flowable resin. Since resin impregnation is to be carried out here, it is necessary to cause reflow of the whole thermosetting resin composing the dry resin layer 4. Therefore, a so called heating oven is adopted as the resin impregnation means regardless of the heating method. When the resin becomes sufficiently reflowable in the heating zone 16 of the resin impregnation means, the reflowable resin is absorbed up to the backbone material 5 in a short time, thereby the impregnation being carried out.

The part of the backbone material 5 to which the resin impregnation is finished is immediately subjected to the temperature decreasing operation upon exiting the heating zone 16 as the resin impregnation means to form a prepreg. For that purpose, the temperature decreasing means for carrying out the temperature decreasing operation is therefore provided downstream of the above described resin impregnation means, in which natural cooling or forced cooling by air blast using a fan is used. FIG. 4 illustrates an air blower 10.

Finally, a winder for rolling the completed prepreg 1 or a cutter for forming cut sheets from the completed prepreg 1 is provided at the downstream of the above described temperature decreasing means as the collecting means of the prepreg 1. Thus, the continuous production of the prepreg 1 for use in producing a printed wiring board having a backbone material 5 impregnated with a thermosetting resin is possible. By using the device, the resin impregnation to the backbone material 5 can be carried out while it is placed on the plane of the metal belt 12, so that the weight of the impregnated resin is not loaded to the backbone material itself, and even when the thickness of the backbone material is extremely decreased, a process trouble such as the break of the backbone material by the resin weight can be eliminated, thereby enabling a stable production of the prepreg 1 using the thin backbone material which has not been usable as a backbone material.

By adopting the above described production method, it has become possible to use a non-woven fabric having a thickness of 70 µm or less and a woven fabric having a thickness of 30 µm or less, which have conventionally been not usable for a prepreg, as a backbone material, thereby opening way to produce a copper clad laminate using a thin prepreg employing a very thin backbone material. The copper clad laminate has a backbone material within its interlayer insulation layer comprising a very thin non-woven or woven fabric, which results in good hole-making property by a carbon dioxide laser.

Figure 6:
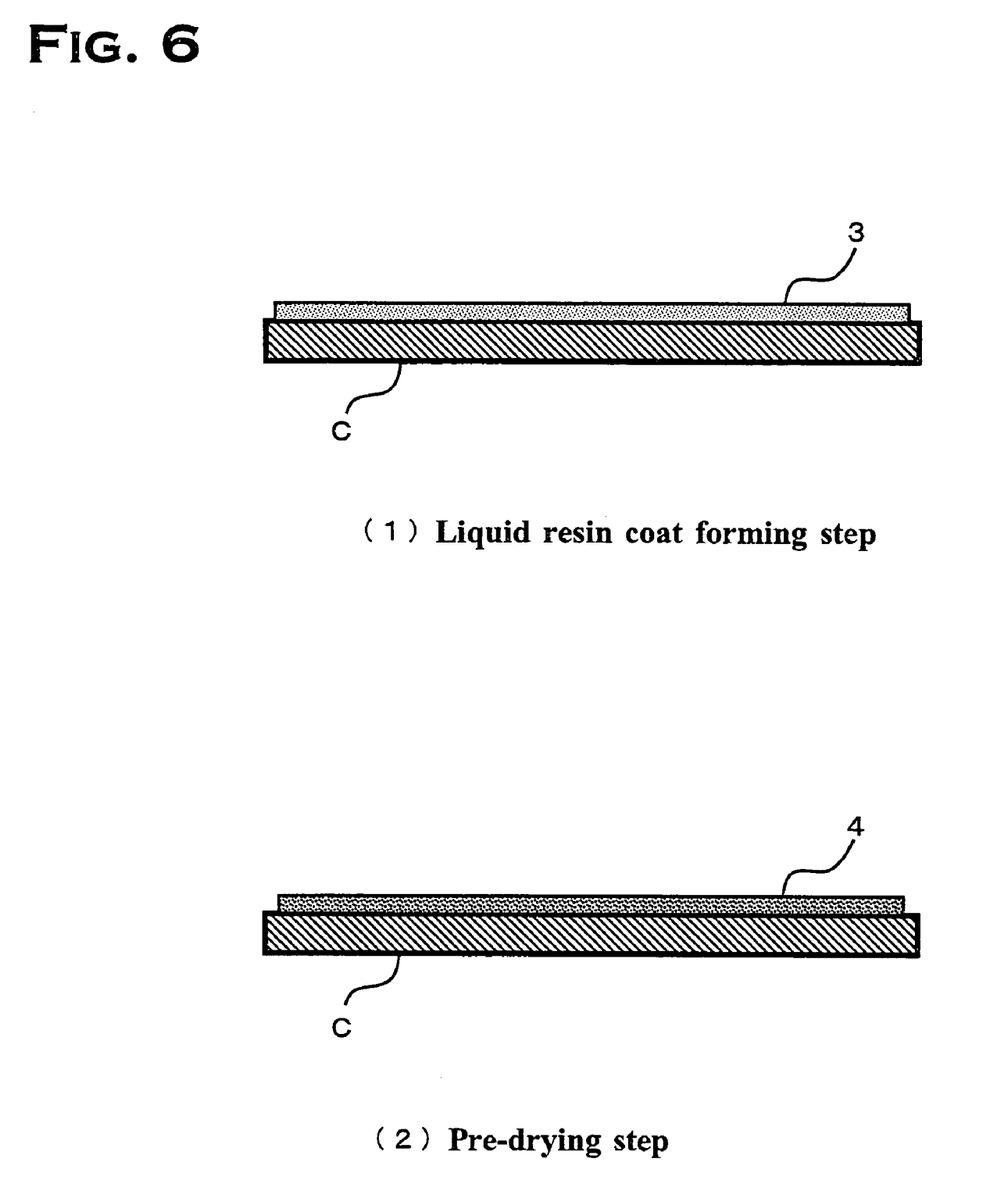
Figure 7:
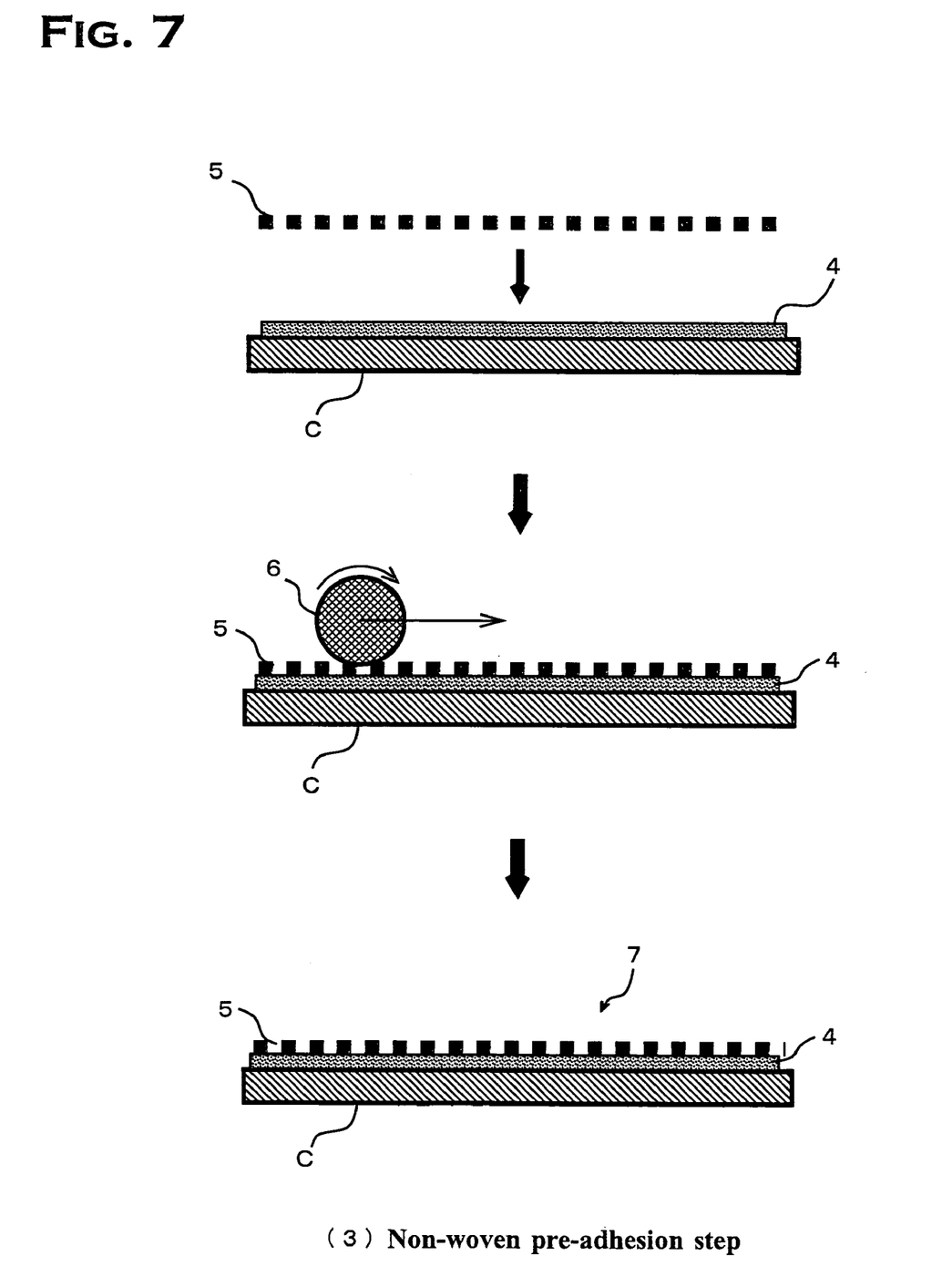
Figure 8:
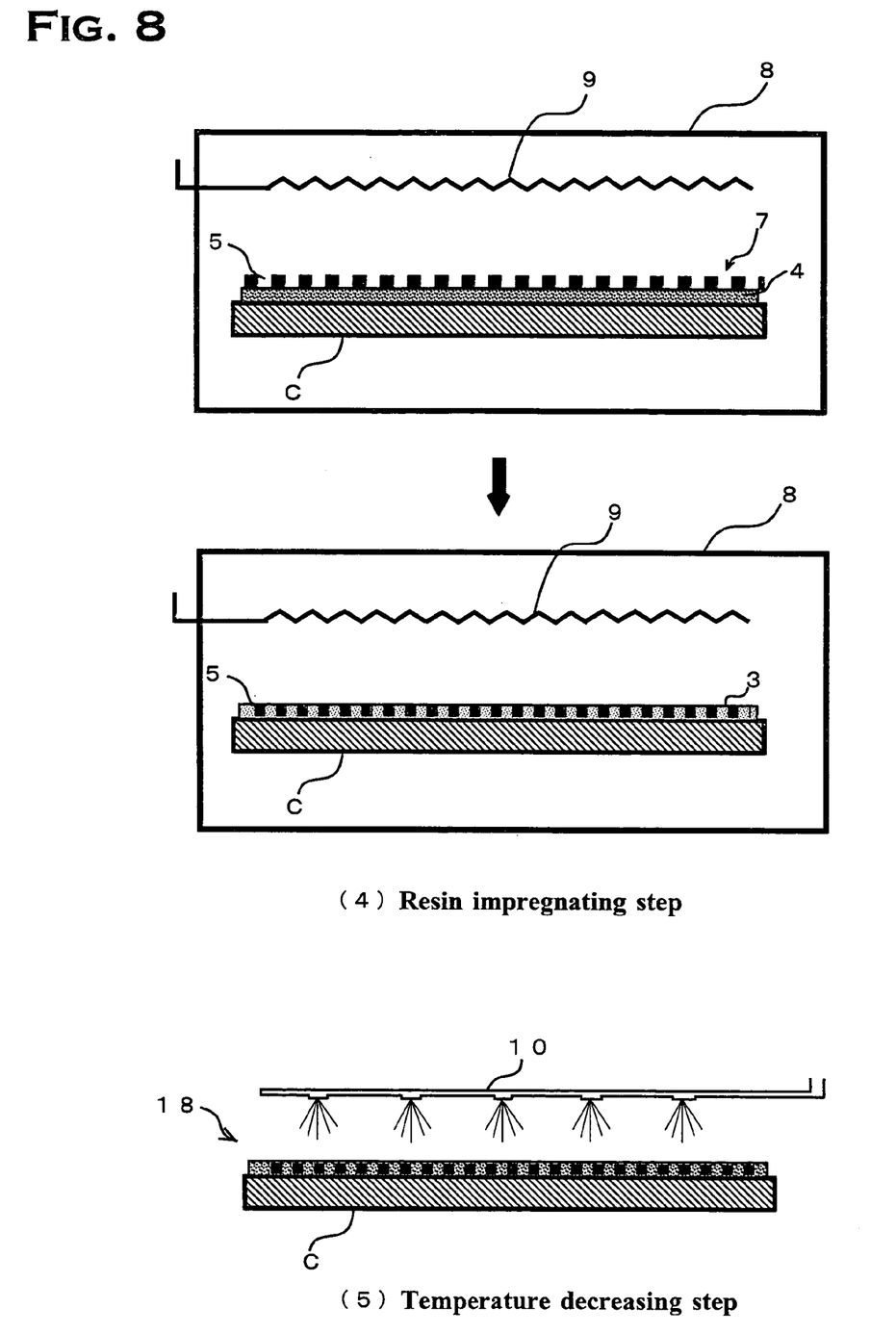

By applying the above described production method, it is possible to easily obtain a product in the form of a copper foil with insulating layer, by carrying out the operation, which has been carried out on a work plane, on the surface of the copper foil. In the claim below, a method for producing a copper foil with insulating layer comprises an insulating layer having a backbone material impregnated with a thermosetting resin on one side thereof, comprising the steps 1 to 5: (1) a liquid resin coat forming step for forming a liquid resin layer as a coat having a predetermined thickness on one side of a copper foil using a liquid thermosetting resin; (2) a pre-drying step for drying the liquid resin layer on one side of the copper foil leaving as it is to form a dry resin layer; (3) a backbone material pre-adhesion step for overlapping the backbone material on the surface of said dry resin layer on one side of the copper foil, pre-heating and pressure bonding to form a dry resin layer with backbone material; (4) a resin impregnation step for heating the resin, while placing the dry resin layer with backbone material on one side of the copper foil, at a temperature where the resin is reflowable, and impregnating said backbone material with a thermosetting resin component; and (5) a cooling step for carrying out a temperature decreasing operation immediately after finishing the resin impregnation without curing the thermosetting resin completely, and forming the copper foil with insulating layer by maintaining a half-cured state of the thermosetting resin impregnated in the backbone material. The flow of these steps are shown in FIGS. 6 to 8, which may be shown by only replacing the work plane in FIGS. 1 to 3 to the copper foil C. Thus, since the description for each step will overlap, the description here is omitted. By this production method, a copper foil with insulating layer 18, which is almost the same as the form of a schematic cross section shown in FIG. 8 (5), can be obtained.

The insulating layer of the copper foil with insulating layer obtained by such a production method includes a backbone material. However, the backbone material can be very thin compared with conventional prepregs, resulting in providing a thin insulating layer. Consequently, the copper clad laminate employing this copper foil with insulating layer may have a thin thickness and will show almost no failure of the backbone material such as crease, break or the like.

BEST MODE FOR CARRYING OUT THE INVENTION

Examples, which are considered to be the best, will now be described for the production method according to the present invention.

EXAMPLE 1

In the present example, a method for producing a prepreg 1 for use in producing a printed wiring board having a non-woven fabric using an aramid fiber having a thickness of 30 µm as a backbone material impregnated with an epoxy-based thermosetting resin in a batch method is described. Each step will now be described step-by-step referring to FIGS. 1 to 3.

A liquid resin layer 3 was first formed as a coat having a thickness of about 16 µm in a region of 50 cm×50 cm on a flat work plane 2 having a size of 55 cm×55 cm using a liquid epoxy-based thermosetting resin, in a liquid resin coat forming step as shown in FIG. 1 (1). The liquid epoxy-based thermosetting resin used here is an epoxy resin composition having a solid content of 60% by weight comprising 30 parts by weight of bisphenol A type epoxy resin (trade name: YD-128, made by Toto Kasei K.K.), 50 parts by weight of o-cresol type epoxy resin (trade name: ESCN-195 XL 80, made by Sumitomo Chemical Co., Ltd.), 16 parts by weight of dicyandiamide (4 parts by weight as dicyandiamide) in the form of a dimethylformamide solution having a solid content of 25% as an epoxy resin curing agent and 0.1 parts by weight of 2-ethyl-4-methylimidazole (trade name: Curezole 2E4MZ, made by Shikoku Corporation) as a curing accelerator, dissolved in a mixed solvent consisting of methyl ethyl ketone and dimethylformamide (mix ratio: methyl ethyl ketone/dimethylformamide=4/6).

In the pre-drying step shown in FIG. 1 (2), the liquid resin layer 3 on the above described work plane 2 was left to stand for 30 minutes at room temperature and blasted hot air of 150° C. for two minutes with a hot air dryer to dry to a half-cured state to form a dry resin layer 4. The dry resin layer 4 had a coating volume of 40 µm as a thickness of the resin after drying. The work plane used here was a copper plate having a thickness of 1 cm with a gloss finished surface.

The non-woven fabric 5 of aramid fiber having a nominal thickness of 30 µm and a size of 50 cm×50 cm was then stacked on the dry resin layer 4. The sticking step includes, as shown in FIG. 2 (3), overlapping the non-woven fabric 5 on the surface of the formed dry resin layer 4 and pressing the heating roll 6, at a speed of 20 cm/min, which is adapted to be able to apply a laminating pressure of 6 kg/cm$^2$ at a temperature of 150° C., to form a dry resin with non-woven fabric layer 7.

The thus obtained dry resin with non-woven fabric layer 7 leaving as it is on the work plane 2 was put into a heating oven 8, as shown in FIG. 3 (4), and heated with a heater 9 to cause to reflow the resin composing the dry resin layer 4 to be impregnated into the non-woven fabric 5. The heating was carried out for three minutes at a temperature in the heating oven of 150° C.

After finishing the resin impregnation, as shown in FIG. 3 (5), the non-woven fabric 5 impregnated with the resin was taken out of the heating oven 8 leaving as it is on the work plane 2 and subjected to air-blast temperature decrease as the temperature decreasing step with an air blower 10 provided with a plurality of blowing ports of purified air. Thus, the prepreg 1 having a thickness of 50 µm was produced. Of the weight of the prepreg 1, the weight of the non-woven fabric was 25% by weight. No process failure occurred in the above production steps, and the phenomenon that the non-woven fabric 5 breaks was naturally not observed.

A one side copper clad laminate 10 was produced, using the prepreg 1, by pressing an electrodeposited copper foil with attached carrier foil comprising an electrodeposited copper foil having a nominal thickness of 3 µm on one side thereof and by removing the carrier foil. As the processing conditions for the production, a press temperature of 180° C., a press pressure of 20 kg/cm$^2$ and a curing time of 90 minutes were adopted.

The electrodeposited copper foil layer of 3 µm in the thus obtained one side copper clad laminate was plated up to a thickness of about 18 µm by an electrolytic plating method, and a cured FR-4 substrate having a thickness of 100 µm was stacked to the base material side of the cured prepreg 1 for reinforcement using adhesives, thus obtaining a sample for measuring peel strength. In this state, a circuit of 0.2 mm was formed by etching, and the peel strength was measured. The results showed very good values, such as a normal peel strength of 1.66 kgf/cm and a peel strength after soldering of 1.58 kgf/cm.

For the copper clad laminate still holding the copper foil layer of 3 μm, a test for making 200 holes of blind via holes each having a diameter of 100 μm was carried out with a carbon dioxide laser hole-making machine. In order to form holes each having a diameter of 100 μm, the irradiation conditions of the carbon dioxide laser were a frequency of 2000 Hz, a mask diameter of 5.0 mm, a pulse width of 60 μsec., a pulse energy of 16.0 mJ, an offset of 0.8 and a laser beam diameter of 130 μm. It was possible to satisfactorily make all of the 200 holes, and the average diameter of the holes was 108 μm.

EXAMPLE 2

In the present example, the prepreg 1 was produced with the continuous production device 11 schematically shown in FIG. 4. A mirror polished stainless steel belt having a width of 52 cm, a thickness of 200 μm and a one-way travel length of 10 m was adopted for the metal belt 12 traveling endlessly with an endless track of the continuous production device 11. The metal belt 12 was adapted to at least continuously travel from resin supply means to cooling means, from an upstream toward a downstream through steps, as shown in FIG. 4.

A resin dispenser 13 of an edge coater type as the resin supply means was provided at the starting end of the upstream of the metal belt 12. The liquid thermosetting resin similar to the one used in Example 1 was put in a holding tank of the resin dispenser 13 and continuously supplied on the above described metal belt 12 from a resin discharge part thereof to form a liquid resin layer 3 having a uniform thickness of 40 μm on the above described metal belt 12.

The liquid resin layer 3 formed on the metal belt 12 traveled for a distance of 1.5 m in the state of natural drying as pre-drying means provided at the downstream of the above described resin supply means, and subsequently subjected to a short heating for five minutes at a drying zone 14, thereby forming a half-cured dry resin layer 4 from the above described liquid resin layer 3 on the above described metal belt 12.

Furthermore, a backbone material supply means for continuously supplying a non-woven fabric 5 into the production line was provided downstream the above described pre-drying means. The backbone material supply means continuously supplied and overlapped the non-woven fabric 5 having a width of 50 cm and a thickness of 70 μm continuously unwound from a backbone material stock roll 15 on the surface of the part of the above described dry resin layer 4 formed on the above described metal belt 12. The unwound speed of the non-woven fabric from the backbone material stock roll 15 and the traveling speed of the metal belt 12 adapted to be matched at 20 cm/min and the non-woven fabric 5 was stacked flat, uniform and without wrinkles.

Non-woven fabric pre-adhesion means was provided at the downstream of the backbone material pre-adhesion means. The non-woven fabric 5 supplied from the backbone material supply means was continuously heated and pressure bonded on the surface of the dry resin layer 4 using the heating roll 6 of the non-woven fabric pre-adhesion means. The pressure bonding of the non-woven fabric 5 by the heating roll 6 caused to reflow only the resin at the top layer of the dry resin layer 4 to form a dry resin with non-woven fabric layer 7 by the heating roll 6 which is adapted to heat at 150° C. and apply a laminating pressure of 6 kg/cm². At this time, no oozing through the non-woven fabric 5 of the resin of the flowable dry resin layer 4 was observed.

A heating zone 16 having a length of 60 cm as resin impregnating means was provided at the downstream of the above described non-woven fabric pre-adhesion means. The part in the form of the dry resin with non-woven fabric layer 7 was heated for three minutes at a temperature of 150° C., which is the curing temperature of the resin or below, using a heater 9 to cause to reflow the thermosetting resin. The flowable resin was absorbed up to the stacked non-woven fabric 5 and impregnated into it.

The part of the non-woven fabric 5 into which the resin is impregnated was subjected to a temperature decreasing operation by blasting air with the air blower 10 shown in FIG. 4 for a distance of 3 m after the heating zone 16 to form a prepreg having a thickness of 90 μm.

Finally, a wounding machine 17 for rolling the completed prepreg 1 was provided at the downstream of the above described temperature decreasing means as a collecting means of the prepreg 1. In this manner, the continuous production of the prepreg 1 having a width of 50 cm for use in producing of a printed wiring board having a backbone material impregnated with a thermosetting resin was carried out. Of the weight of the prepreg 1, the weight of the non-woven fabric was 25% by weight. By using this device, the resin impregnation to the non-woven fabric 5 was carried out while it is placed on the plane of the metal belt 12, so that the weight of the impregnated resin was not loaded to the non-woven fabric itself, and even when the non-woven fabric 5 had a thickness of 70 μm, a process trouble such as the break of the non-woven fabric 5 by the resin weight was eliminated, thereby enabling a stable production of the prepreg 1 using the thin non-woven fabric continuously as a backbone material.

A one side copper clad laminate 10 was produced using the thus obtained prepreg 1, according to a method similar to Example 1, by pressing an electrodeposited copper foil with attached carrier foil comprising an electrodeposited copper foil having a nominal thickness of 3 μm on one side thereof and by removing the carrier foil, and served for measuring peel strength. The results showed very good values, such as a normal peel strength of 1.63 kgf/cm and a peel strength after soldering of 1.60 kgf/cm. The copper clad laminate was also subjected to a hole-making test similar to Example 1 by a carbon dioxide laser hole-making machine. It was possible to satisfactorily make all of the 200 holes, and the average diameter of the holes was 109 μm.

EXAMPLE 3

In the present example, a method for producing a prepreg 1 for use in producing a printed wiring board using an SP glass cloth which is a woven fabric having a thickness of 15 μm as a backbone material impregnated with an epoxy-based thermosetting resin in a batch method is described. Each step will now be described step-by-step referring to FIGS. 1 to 3. Common reference numerals as the above described non-woven fabric are used for the SP glass cloth which is a backbone material, and common reference numerals as Example 1 are used for other terms having a common nature for convenience' sake in description.

Similar to Example 1, a liquid resin layer 3 was first formed as a coat having a thickness of about 16 μm in a region of 50 cm×50 cm on a flat work plane 2 having a size of 55 cm×55 cm using a liquid epoxy-based thermosetting resin, in a liquid resin coat forming step as shown in FIG. 1 (1). The liquid epoxy-based thermosetting resin used here is the same as those used in Example 1, so that the detail description will be omitted.

In the pre-drying step shown in FIG. 1 (2), the liquid resin layer 3 on the above described work plane 2 was left to stand for 30 minutes at room temperature and blasted hot air of 150° C. for two minutes with a hot air dryer to dry to a half-cured state to form a dry resin layer 4. The dry resin layer 4 had a coating volume of 15 μm as a thickness of the resin after drying. The work plane used here was a copper plate having a thickness of 1 cm with a gloss finished surface.

The SP glass cloth 5 having a nominal thickness of 15 μm and a size of 50 cm×50 cm was stacked on the dry resin layer 4. The sticking step includes, as shown in FIG. 2 (3), overlapping the SP glass cloth 5 on the surface of the formed dry resin layer 4 and pressing the heating roll 6, at a speed of 20 cm/min, which is adapted to be able to apply a laminating pressure of 6 kg/cm$^2$ at a temperature of 150° C., to form a dry resin layer with SP glass cloth 7.

The thus obtained dry resin layer with SP glass cloth 7 leaving as it is on the work plane 2 was put into a heating oven 8, as shown in FIG. 3 (4), and heated with a heater 9 to cause to reflow the resin composing the dry resin layer 4 to be impregnated into the SP glass cloth 5. The heating was carried out for three minutes at a temperature in the heating oven of 150° C.

After finishing the resin impregnation, as shown in FIG. 3 (5), the SP glass cloth 5 impregnated with the resin was taken out of the heating oven 8 leaving as it is on the work plane 2 and subjected to air-blast temperature decrease as the temperature decreasing step with an air blower 10 provided with a plurality of blowing ports of purified air. Thus, the prepreg 1 having a thickness of 20 μm was produced. Of the weight of the prepreg 1, the weight of the non-woven fabric was 28% by weight. No process failure occurred in the above production steps, and the phenomenon that the SP glass cloth 5 having a very thin thickness of 15 μm was broken was naturally not observed.

A one-side copper clad laminate 10 was produced, using the prepreg 1, by pressing an electrodeposited copper foil with attached carrier foil comprising an electrodeposited copper foil having a nominal thickness of 3 μm on one side thereof onto the prepreg and then by removing the carrier foil. As the processing conditions for the production, a press temperature of 180° C., a press pressure of 20 kg/cm$^2$ and a curing time of 90 minutes were adopted.

The electrodeposited copper foil layer of 3 μm in the thus obtained one side copper clad laminate was plated up to a thickness of about 18 μm by an electrolytic plating method, and a cured FR-4 substrate having a thickness of 100 μm was stacked to the base material side of the cured prepreg 1 for reinforcement using adhesives, thus obtaining a sample for measuring peel strength. In this state, a circuit of 0.2 mm was formed by etching, and the peel strength was measured. The results showed very good values, such as a normal peel strength of 1.61 kgf/cm and a peel strength after soldering of 1.61 kgf/cm.

Laser processing properties were evaluated using a carbon dioxide laser hole-making machine by a method similar to Example 1. It was possible to satisfactorily make all of the 200 holes, and the average diameter of the holes was 101 μm.

EXAMPLE 4

In the present example, a method for producing a copper foil with insulating layer comprising an insulating layer having a non-woven fabric using an aramid fiber having a thickness of 30 μm as a backbone material impregnated with an epoxy-based thermosetting resin in a batch method is described. Each step will now be described step-by-step referring to FIGS. 6 to 8.

A liquid resin layer 3 was first formed in a region of 50 cm×50 cm, as a coat on a surface for adhesion of a copper foil C having a size of 55 cm×55 cm and a thickness of 18 μm placed on a flat work plane, using a liquid epoxy-based thermosetting resin in the liquid resin coat forming step as shown in FIG. 6 (1). The liquid epoxy-based thermosetting resin used here is similar to those used in Example 1, so that the description will be omitted.

In the pre-drying step shown in FIG. 6 (2), the liquid resin layer 3 on the above described work plane 2 was left to stand for 30 minutes at room temperature and blasted hot air of 150° C. for two minutes with a hot air dryer to dry to a half-cured state to form a dry resin layer 4. The dry resin layer 4 had a coating volume of 40 μm as a thickness of the resin after drying. The work plane used here was a copper plate having a thickness of 1 cm with a gloss finished surface.

The non-woven fabric 5 of aramid fiber having a nominal thickness of 30 μm and a size of 50 cm×50 cm was stacked on the dry resin layer 4. The sticking step includes, as shown in FIG. 7 (3), overlapping the non-woven fabric 5 on the surface of the formed dry resin layer 4 and pressing a heating roll 6, at a speed of 20 cm/min, which is adapted to be able to apply a laminating pressure of 6 kg/cm$^2$ at a temperature of 150° C., to form a dry resin with non-woven fabric layer 7.

The thus obtained dry resin with non-woven fabric layer 7 leaving as it is on the copper foil C was put into a heating oven 8, as shown in FIG. 8 (4), and heated with a heater 9 to cause to reflow the resin composing the dry resin layer 4 to be impregnated into the non-woven fabric 5. The heating was carried out for three minutes at a temperature in the heating oven of 150° C.

After finishing the resin impregnation, as shown in FIG. 8 (5), air-blast temperature decrease was carried out as the temperature decreasing step with an air blower 10 provided with a plurality of blowing ports of purified air. Thus, it was possible to produce the copper foil with insulating layer 18 comprising an insulating layer having a thickness of 50 μm. Of the insulating layer, the weight of the non-woven fabric was 25% by weight.

INDUSTRIAL APPLICABILITY

By using the method for producing a prepreg according to the present invention, it is possible to stably produce a prepreg using a non-woven fabric having a thickness of 70 μm or less or a woven fabric having a thickness of 30 μm or less, which were unable to be applied for mass production use in a conventional method for producing a prepreg. Thus, it is possible to provide a prepreg using a non-woven or woven fabric which is thinner than ever, while securing excellent laser hole-making property obtainable by using the non-woven fabric as a backbone material. In addition, by applying this method for producing a prepreg, it becomes possible to easily provide a copper foil with insulating layer comprising a very thin insulating layer, which facilitates the production of a thin printed wiring board.

The invention claim is:

1. A method for producing a thin prepreg for use in producing a printed wiring board having a backbone material impregnated with a thermosetting resin, comprising the steps (1) to (5):
   (1) a liquid resin coat forming step for forming a liquid resin layer as a coat having a predetermined thickness on a flat work plane by use of a liquid thermo setting resin and a solvent;
   (2) a pre-drying step for drying the liquid resin layer on the work plane as it is, to form a dry resin layer;
   (3) a backbone material pre-adhesion step for overlapping the backbone material on the surface of said dry resin layer on the work plane, pre-heating and pressure bonding to form a dry resin layer with backbone material;
   (4) a resin impregnation step for heating the resin, while the dry resin layer with backbone material remains on the work plane, at a temperature where the resin is reflowable, and impregnating said backbone material with a thermosetting resin component; and
   (5) a cooling step for carrying out a temperature decreasing operation immediately after finishing the resin impregnation without curing the thermosetting resin completely to form the prepreg by maintaining a half-cured state of the thermosetting resin impregnated in the backbone material.

2. The method of claim 1, wherein said backbone material is a non-woven fabric made from aramid fibers or glass fibers having a nominal thickness of 70 μm or below.

3. The method of claim 1, wherein said backbone material is a glass cloth having a nominal thickness of 30 μm or below.

4. A method for producing a copper foil with insulating layer comprising an insulating layer having a backbone material impregnated with a thermosetting resin on one side thereof, comprising the steps (1) to (5):
   (1) a liquid resin coat forming step for forming a liquid resin layer as a coat having a predetermined thickness on one side of a copper foil by use of a liquid thermosetting resin and a solvent;
   (2) a pre-drying step for drying the liquid resin layer on one side of the copper foil as it is to form a dry resin layer;
   (3) a backbone material pre-adhesion step for overlapping the backbone material on the surface of said dry resin layer on one side of the copper foil, pre-heating and pressure bonding to form a dry resin layer with backbone material;
   (4) a resin impregnation step for heating the resin, while the dry resin layer with backbone material remains on one side of the copper foil, at a temperature where the resin is reflowable, and impregnating said backbone material with a thermosetting resin component; and
   (5) a cooling step for carrying out a temperature decreasing operation immediately after finishing the resin impregnation without curing the thermosetting resin completely to form the copper foil with insulating layer by maintaining a half-cured state of the thermosetting resin impregnated in the backbone material.

5. A method for the manufacture of a thin prepreg for use in a printed wiring board comprising the steps of:
   coating a liquid resin layer having a predetermined thickness on a flat work plane wherein said liquid resin layer is comprised of a liquid thermosetting resin containing a solvent;
   drying said liquid resin layer on the flat work plane to form a dry resin;
   stacking a backbone material wherein said backbone material is a fabric having a nominal thickness of no more than 70 μm onto the surface of the dry resin layer;
   pressing a heating roll onto the backbone material under conditions of predetermined temperature and pressure sufficient to adhere the backbone material to the surface of the dry resin layer without strikethrough to form a dry resin layer with backbone material laminated thereto in a heating oven; heating said dry resin layer with backbone material laminated thereto to cause a reflow of resin within the dry resin layer thereby impregnating the resin into the backbone material;
   removing said dry resin layer with backbone material laminated thereto from the heating oven; and thereafter
   decreasing the temperature of the dry resin layer with backbone material laminated thereto;
   wherein said dry resin layer with backbone material laminated thereto forms a thin prepreg for use in a printed wiring board.

6. The method of claim 5 wherein said predetermined pressure of the heating roll prevents oozing of said resin through said backbone material.

7. The method of claim 5 wherein said flat work plane has a thickness of 50 μm–400 μm.

8. The method of claim 5 wherein said backbone material is a non-woven fabric having a nominal thickness of 70 μm or below made from aramid fibers or glass fibers.

9. The method of claim 5 wherein said backbone material is a glass cloth having a nominal thickness of 30 μm or below.

10. The method of claim 8 wherein said non-woven fabric made from aramid fibers is 20% to 40% by weight.

11. The method of claim 8 wherein said non-woven fabric made from glass is 20% to 50% by weight.

12. The method of claim 5 wherein said thin prepreg has a thickness of 50 μm.

13. A method for the manufacture of a copper foil having an insulating layer comprising the steps of:
   forming a liquid resin layer having a predetermined thickness wherein said liquid resin layer is comprised of thermosetting liquid resin and a solvent;
   coating a copper foil with said liquid resin layer;
   drying said liquid resin layer on said copper foil under conditions of temperature and pressure to form a dry resin layer in a half-cured state;
   stacking a non-woven fabric onto the surface of the dry resin layer on said copper foil;
   pressing a heating roll under conditions of temperature and pressure to adhere the non-woven fabric on the surface of the dry resin layer without strikethrough to form a dry resin layer with non-woven fabric layer laminated thereto;
   heating said dry resin layer with non-woven fabric layer laminated thereto in a heating oven to cause a reflow of resin within the dry resin layer thereby impregnating the resin into the non-woven fabric;

removing said dry resin layer with non-woven fabric layer laminated thereto from the heating oven; and thereafter decreasing the temperature of the dry resin layer with backbone material laminated thereto;

wherein said dry resin layer with backbone material laminated thereto forms a thin prepreg for use in a printed wiring board.

14. The method of claim 1 wherein said flat work plane is a metal belt.

15. The method of claim 5 wherein said flat work plane is a metal belt.

* * * * *